United States Patent [19]

Winter et al.

[11] 4,050,147
[45] Sept. 27, 1977

[54] METHOD FOR THE PRODUCTION OF DUCTILE AND STABLE PARTICLE-SUPERCONDUCTORS

[76] Inventors: Heinrich Winter, Kurt-Schrumacherstr. 4, Eschborn; Darius N. Sethna, Hedwig Dransfeldstr. 3, Frankfurt, both of Germany

[21] Appl. No.: 676,589

[22] Filed: Apr. 13, 1976

[30] Foreign Application Priority Data

Apr. 16, 1975 Germany .............................. 2516747

[51] Int. Cl.² .................... H01L 39/12; B22F 1/00; H01L 39/24
[52] U.S. Cl. ................................ 29/599; 29/420.5; 75/.5 BB
[58] Field of Search .......... 29/420, 420.5, 599; 75/211, 212, 214, .5 A, .5 BB; 148/11.5 R, 11.5 Q, 11.5 P

[56] References Cited

U.S. PATENT DOCUMENTS

| | | | |
|---|---|---|---|
| 2,866,842 | 12/1958 | Matthias | 29/599 |
| 3,211,548 | 12/1965 | Scheller et al. | 75/.5 BB |
| 3,407,049 | 10/1968 | Freeman et al. | 29/599 |
| 3,475,158 | 10/1969 | Neuenschwander | 75/.5 BB |
| 3,496,622 | 2/1970 | Berghout et al. | 29/599 |
| 3,509,622 | 5/1970 | Bernert et al. | 29/599 |
| 3,592,627 | 7/1971 | Neuenschwander | 75/.5 BB |
| 3,630,718 | 12/1971 | Neuenschwander | 75/.5 BB |

FOREIGN PATENT DOCUMENTS

| | | | |
|---|---|---|---|
| 19,541 | 3/1970 | Japan | 29/599 |
| 1,209,490 | 10/1970 | United Kingdom | 29/599 |

*Primary Examiner*—E. M. Combs
*Attorney, Agent, or Firm*—Sughrue, Rothwell, Mion, Zinn and Macpeak

[57] ABSTRACT

A method of the producing a ductile and stable particle superconductor, as well as the product itself, from particles of the formula NbN, $NbN_{1-x}C_x$ where $x$ is less than or equal to 0.5, $Nb_3Al$, $Nb_3Si$, $Nb_3Ge$, $Nb_3Sn$, $V_3Ga$ or $V_3Si$ from a reaction in a hydrogen plasma. The particles are incorporated into a metallic matix or coprecipitated with a metal powder.

15 Claims, No Drawings

METHOD FOR THE PRODUCTION OF DUCTILE AND STABLE PARTICLE-SUPERCONDUCTORS

The invention refers to a method for the production of a ductile and stable particle superconductor.

The first particle superconductor was realized by Watson in App. Phys. Letters, 15 (125) 1969 by filling the pores of leached surfaces of Vycor glass by means of pressure with a lead melt. The pores had diameters of 20 - 30 A and a distance of 10 - 20 A. The resulting composite showed a critical temperature slightly above that of bulk lead and values of the upper critical magnetic field $H_{c2}$ tow orders higher. This indicates that lead, a superconductor of the first kind, was transformed into a superconductor of the second kind simply by arranging superconducting particles of 20 - 30 A diameter with a distance of 10 - 20 A in a non superconducting matrix. The effect was explained by the ability of the electrons in the form of Copper-pairs to tunnel the non-superconducting walls between the superconducting particles. The theory of McMillan in Phys. Rev. 167, 331 (1968) as applied by the Watson Article and Hake in App. Phys. Letters, 10, 189 (1967) to this special case gives the theoretical background.

There have been many attempts to apply the principle of Watson to particle superconductors with a metallic matrix. Particle superconductors consisting of small particles of brittle superconducting compounds dispersed in a metallic matrix promise a combination of good ductility, high tensile strength and superior superconducting preperties. Up to now the enhanced superconducting properties of Watsons particle superconductors with a glass matrix could not be realized in a particle superconductor with a metal matrix. Tsuei in Science 180, 57 (April 1973) tried to precipitate the superconducting particles from the melt and Mordike In J. Less-Common Metals, 11, 365-375 (1966), worked with powdermetallurgical methods. The values of the critical temperature $T_c$ and the critical current density $J_c$ of the bulk superconductors could not be surpassed with the resulting composites. Nevertheless theory as set forth in the Watson and McMillan articles, predicts critical temperatures $T_c$ up to 40° K for $V_3Si$-particles sufficiently small and closely arranged.

The reason for the unsuccessful attempts to realize a superior particle superconductor with a metallic matrix lies in the fact, that superconducting particles with the required size of 20 - 500 A could not be produced from the compounds of interest; furthermore the careful dispersion of those particles in a non superconducting matrix would cause some problems.

Therefore in the following invention a method is given, which makes it possible to produce these superconducting compounds on a large scale and in an economical way in the required size and form. Furthermore ways are shown to distribute these particles evenly with the required distance in a non superconducting marix; the resulting composites finally show the superconducting properties which can be expected from the theory.

The superconducting particles are compounds of niobium or vanadium as NbN, $NbN_xC_{1-x}$ with $0.5 \leq x \leq 1$ or $A_3B$ compounds with $\beta W/A15$ structure; here A stands for Nb or V and B for Al,Ge,Si,Ga or Sn.

The compounds are produced by a reaction in the gas phase. Halogen-compounds of Nb or V are introduced in a reaction zone together with hydrogen and either nitrogen or or halogen compounds of Al,Ge,Si,Ga or Sn.

A preferred method for the production of superconducting compounds with the required size according to the invention is to introduce the halogen compounds of Nb or V into a hydrogen plasma together with N and/or a hydrocarbon like methane; this method was first described by Neuenschwander in J. Less-Common Metals, 11, 365-375(1966) for the preparation of TiN or T a C as well as Nb with a particle size of about 100 - 500 A. The hydrogen plasma with a temperature of about 3000° C is generated by an electric arc burning between a water cooled Wolfram cathode and a similarly cooled copper anode; the copper anode has a central boring through which the hydrogen is introduced. The electrical values for the arc are for instance 200 A and 120 V. The particles resulting from the reaction fall out and are gathered on the floor of the enclosing container. Surprisingly it turned out that this method excellently can be employed for the mass production of $A_3B$ compounds with $\beta W/A15$ structure, a fact of which Neuenschwander has not been aware. Some of the reaction mehcanisms are presented in the following lines:

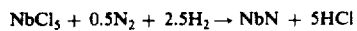

$NbCl_5 + 0.5N_2 + 2.5H_2 \rightarrow NbN + 5HCl$

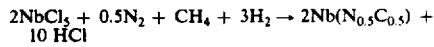

$2NbCl_5 + 0.5N_2 + CH_4 + 3H_2 \rightarrow 2Nb(N_{0.5}C_{0.5}) + 10\ HCl$

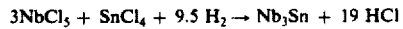

$3NbCl_5 + SnCl_4 + 9.5\ H_2 \rightarrow Nb_3Sn + 19\ HCl$

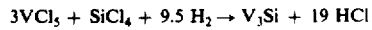

$3VCl_5 + SiCl_4 + 9.5\ H_2 \rightarrow V_3Si + 19\ HCl$

Furthermore it became possible to bring down the size of the resulting particles to 70 A by increasing the current and the voltage of the arc to 500 A and 150V. The particles were carefully stored under argon or helium with a reduced pressure.

According to the invention, the incorporation of these fine superconducting particles with a medium diameter of up to about 500 A into a ductile metallic matrix was accomplished by three different methods as described hereafter.

The first method is based on conventional powder-metallurgy. A carefully prepared mixture of $A_3B/BW$ compounds as $Nb_3Sn$ or $V_3Si$ with a medium particle diameter below 500 A and a metal like copper with about the same particle size was compacted, sheathed in a container of the same metal, evacuated and closed; subsequently the compacts were extruded and further drawn into wires with a diameter of about 1 mm. using $Nb_3Sn$ particles with a medium diameter of 300 A and copper particles with about 400 A and a volume of 35% $Nb_3Sn$ and 65% Cu, the resulting superconducting and mechanical values of the 1mm diameter wire after an annealing treatment at 700° C for 1 hour were:

| | | | |
|---|---|---|---|
| $T_c$ | : 21° K | Tensile strength | : 74 kp/mm² |
| $H_{c2}$ | : 470 kG | elongation | : 9% |
| $J_c$ | : 7 × 10⁵ A/cm² | | |

The copper particles were produced by vacuum evaporation and stored under vacuum; in contact with air they proved to be pyrophorous.

By comparison, using conventionally prepared $Nb_3Sn$ powders made by ball milling the smallest size reached was about 20 000 A or 2 μm; mixing with conventionally prepared copper powders with a diameter of about 3 μm compacting the mixture and sheathing it in copper, after evacuating and extruding and drawing into wires with about 1mm in diameter, the following superconducting values after an annealing treatment of 1 hour at 700° C for a mixture of 35volume% $Nb_3Sn$ and 65 volume% Cu were measured:

| | | | |
|---|---|---|---|
| $T_c$ | : 17.8° K | Tensile strength | : 57 kp/mm$^2$ |
| $H_{c2}$ | : 180 kG | elongation | : 3 % |
| $J_c$ | : 2 × 10$^4$ A/cm$^2$ | | |

The second method chosen according to the invention for the incorporation of the minute superconducting particles into a metallic matrix avoided the fire hazards and the tendency of contamination of the fine metal powders with the atmosphere; furthermore only 20 volume% of superconducting particles in the metal matrix were necessary for optimum results. About 300g of $Nb_3Sn$ particles with a mediumm diameter of 200 A were suspended in an acid $CuSO_4$ electrolyte of about 1 liter(1000 cm$^3$) with the help of a wetting agent like monolaurylsulfuric-acidester; by galvanic deposition of the suspension electrolyte on a moving belt or a rotating drum, both with a stainless-steel surface, the resulting particles with a size of about 200 μm were continously scraped off and dried; they proved to be dispersion powders, that means, a fine dispersion of regularly spaced $Nb_3Sn$ particles in a copper matrix; these powders were compacted, sheathed in a copper can, extruded and worked into semifinished material like plate, tube or wire. After an annealing treatment at 650° C for 1.5 hours, a tube with an outer diameter of 20 mm and a wall thickness of 1 mm, suitable for conducting the cooling medium like liquid helium, showed the following superconducting and mechanical values employing a mixture of 20 volume% of $Nb_3Sn$ and 80 volume% of Cu:

| | | | |
|---|---|---|---|
| $T_c$ | : 23° K | Tensile strength | : 78 kp/mm$^2$ |
| $H_{c2}$ | : 570 kG | elongation | : 7% |
| $J_c$ | : 9 × 10$^5$ A/cm$^2$ | | |

The resulting tubes can be cooled with liquid hydrogen, leaving sufficient superconducting properties for technical use. The third method showed the finest distribution of superconducting particles in a metal matrix and employed so called duplex powders; the superconducting particles falling out of the hydrogen plasma reaction zone were covered at the same time with a layer of the metal by introducing a halogenide of the metal, like copper, into the reaction zone.

The resulting particles bearing the required layer thickness — for the 100 A particles of $Nb_3Sn$ or $V_3Si$ about 40 A — were strictly kept under argon or helium to avoid contamination with the atmosphere, compacted, canned into thin copper tubes, evacuated and extruded into semifinished material like rods, tubes and wire. Using $Nb_3Sn$ particles of about 100 A diameter and a copper layer of about 40 A, the resulting wire showed after an annealing treatment for 2 hours and 700° C the following superconducting and mechanical values:

| | | | |
|---|---|---|---|
| $T_c$ | : 24.7° K | Tensile strength | : 82 kp/mm$^2$ |
| $H_{c2}$ | : 710 kG | elongation | : 7 % |
| $J_c$ | : 9 × 10$^5$ A/cm$^2$ | | |

Using 100 A particles of $V_3Si$ covered according to the invention with a layer of about 40 A of copper, the resulting wire showed superconducting fluctuations already at 29 K; here a broad transition range started. The maximum upper critical magnetic field $H_{c2}$ at 4.2° K nearly reached 1 Megagauss.

Furthermore it lies in the scope of the invention, to cover metallic or electrically conducting surfaces with superconducting layers by the galvanic method of codeposition of a metal and superconducting particles from a suspension electrolyte. Here too with diameters for the superconducting particles below 500 A superior superconducting properties were realized compared with layers, incorporating coarser superconducting particles with diameters greater than 1000 A. The results were comparable with the given examples for the first and second methods.

What is claimed is:

1. A method for the production of ductile and stable particle-super conductors comprising the steps of:
   a. producing superconducting particles having an average particle diameter of 20 to 500 A by reacting, in a hydrogen plasma,
      i. a halogenide of niobium with nitrogen to give NbN;
      ii. a halogenide of niobium with nitrogen and methane to give $NbN_{1-x}C_x$ with $x$ being less than or equal to 0.5;
      iii. a halogenide of niobium with a halogenide of aluminum to give $Nb_3Al$;
      iv. a halogenide of niobium with a halogenide of silicon to give $Nb_3Si$;
      v. a halogenide of niobium with halogenide of germanium to give $Nb_3Ge$;
      vi. a halogenide of niobium with a halogenide of tin to give $Nb_3Sn$;
      vii. a halogenide of vanadium and a halogenide of gallium to give $V_3Ga$; or
      viii. a halogenide of vanadium with a halogenide of silicon to give $V_3Si$;
   b. incorporating the product particles produced in step (a) in a metallic matrix with distances between said particles between 20 and 500 A;
   c. compacting the resulting metallic matrix; and
   d. fabricating the product produced from step (c) into semi-finished products.

2. The method of claim 1, wherein said step (b) is accomplished by mixing powders of said superconducting particles with powders of a metal selected from the group consisting of copper, silver, gold or aluminum.

3. The method of claim 1, wherein said step (b) is accomplished by suspending the superconducting particles in an electrolyte and coprecipitating a metal powder selected from the group consisting of copper, silver, gold or aluminum and the superconducting particles in the form of a powder dispersion by galvanic action.

4. The method of claim 1, wherein said step (b) is acomplished by covering the superconducting particles with a layer of a metal selected from the group consisting of copper, silver, gold or aluminum during said step (a) by adding a metal vapor into the reaction zone.

5. The method of claim 1, wherein said step (d) is accomplished by rolling.

6. The method of claim 1, wherein said step (d) is accomplished by extrusion.

7. The method of claim 1, wherein said step (d) is accomplished by drawing.

8. The product produced by the method of claim 1.

9. The method of claim 2 wherein said particles produced in step (a) have a diameter of from 70 to 500 A and said metal powder is copper which is used in an amount of from 50 to 90 volume percent of the mixture.

10. The method of claim 9, wherein said copper is manufactured by vacuum evaporation.

11. The method of claim 3 wherein said susperconducting particles have a diameter of 70 to 500 A and are suspended in a copper electolyte in an amount up to 350 grams per liter and said coprecipitating is onto a surface of stainless steel.

12. The method of claim 3, wherein a wetting agent is present in said electrolyte.

13. The method of claim 4, wherein said metal is copper and is deposited onto said superconducting particles by introducing $CuCl_2$ vapor into said reaction zone.

14. A method for the production of ductile and stable particle-super conductors comprising the steps of:
    a. producing superconducting particles having an average particle diameter of 20 to 500 A by reacting, in a hydrogen plasma,
        i. a halogenide of niobium with nitrogen to give NbN;
        ii. a halogenide of niobium with nitrogen and methane to give $NbN_{1-x}C_x$ with $x$ being less than or equal to 0.5;
        iii. a halogenide of niobium with a halogenide of aluminum to give $Nb_3Al$;
        iv. a halogenide of niobium with a halogenide of silicon to give $Nb_3Si$;
        v. a halogenide of niobium with a halogenide of germanium to give $Nb_3Ge$;
        vi. a halogenide of niobium with a halogenide of tin to give $Nb_3Sn$;
        vii. a halogenide of vanadium and a halogenide of gallium to give $V_3Ga$; or
        viii. a halogenide of vanadium with a halogenide of silicon to give $V_3Si$;
    b. incorporating the product particles produced in step a) in a metallic matrix with distances between said particles between 20 and 500 A by suspending the superconnecting particles in an electrolyte and coprecipitating a metal powder selected from the group consisting of copper, silver, gold or aluminum and the superconducting particles by galvanic action onto an electrically conducting surface.

15. The method of claim 14, wherein said electrically conducting surface is a metallic surface.

* * * * *